(12) United States Patent
Liu et al.

(10) Patent No.: US 10,934,484 B2
(45) Date of Patent: Mar. 2, 2021

(54) ETCHING SOLUTION FOR SELECTIVELY REMOVING SILICON-GERMANIUM ALLOY FROM A SILICON-GERMANIUM/ GERMANIUM STACK DURING MANUFACTURE OF A SEMICONDUCTOR DEVICE

(71) Applicant: Versum Materials US, LLC, Tempe, AZ (US)

(72) Inventors: Wen Dar Liu, Chupei (TW); Yi-Chia Lee, Chupei (TW)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/285,961

(22) Filed: Feb. 26, 2019

(65) Prior Publication Data
US 2019/0276739 A1 Sep. 12, 2019

Related U.S. Application Data

(60) Provisional application No. 62/641,168, filed on Mar. 9, 2018.

(51) Int. Cl.
| C09K 13/00 | (2006.01) |
| H01L 21/02 | (2006.01) |
| H01L 21/306 | (2006.01) |
| H01L 29/06 | (2006.01) |
| H01L 29/423 | (2006.01) |
| H01L 29/786 | (2006.01) |
| C09G 1/00 | (2006.01) |

(52) U.S. Cl.
CPC ........ *C09K 13/00* (2013.01); *H01L 21/02057* (2013.01); *H01L 21/30604* (2013.01); *C09G 1/00* (2013.01); *H01L 29/0673* (2013.01); *H01L 29/42392* (2013.01); *H01L 29/78684* (2013.01); *H01L 29/78696* (2013.01)

(58) Field of Classification Search
CPC ............. F15B 13/0402; F15B 13/0431; Y10T 137/86614; C09K 13/00; C09K 13/02; H01L 21/02057; H01L 21/30604; H01L 29/0673; H01L 29/42392; H01L 29/78684; H01L 29/78696; C09G 1/00; C23F 1/00
USPC ..... 252/79.1, 79.2, 79.3; 438/691, 692, 693, 438/745, 750, 752, 753
See application file for complete search history.

(56) References Cited

U.S. PATENT DOCUMENTS

| 2005/0020008 A1* | 1/2005 | Moumen ........... H01L 21/30604 438/248 |
| 2005/0169096 A1 | 8/2005 | Lee et al. |

(Continued)

FOREIGN PATENT DOCUMENTS

| CN | 104145324 A | 11/2014 |
| CN | 105431506 A | 3/2016 |

(Continued)

*Primary Examiner* — Lan Vinh

(57) ABSTRACT

Described herein is an etching solution comprising water; an oxidizer; a water-miscible organic solvent; a fluoride ion source; a corrosion inhibitor and optionally, a surfactant, optionally a buffer, optionally a chelating agent. Such compositions are useful for the selective removal of silicon-germanium over germanium from a microelectronic device having such material(s) thereon during its manufacture.

25 Claims, 1 Drawing Sheet

(56) References Cited

U.S. PATENT DOCUMENTS

| | | | |
|---|---|---|---|
| 2015/0307818 A1* | 10/2015 | Barnes .............. | H01L 21/02063 |
| | | | 510/175 |
| 2016/0032186 A1* | 2/2016 | Chen ........................ | C23F 1/26 |
| | | | 252/79.3 |
| 2017/0145311 A1* | 5/2017 | Liu ................... | H01L 21/30604 |
| 2018/0197746 A1 | 7/2018 | Bilodeau et al. | |

FOREIGN PATENT DOCUMENTS

| | | |
|---|---|---|
| CN | 105683336 A | 6/2016 |
| EP | 3447791 A1 | 2/2019 |
| KR | 20170034036 A | 3/2017 |
| TW | 201631217 A | 12/2014 |
| TW | 201704538 | 2/2017 |
| WO | 2017007893 A1 | 1/2017 |

\* cited by examiner

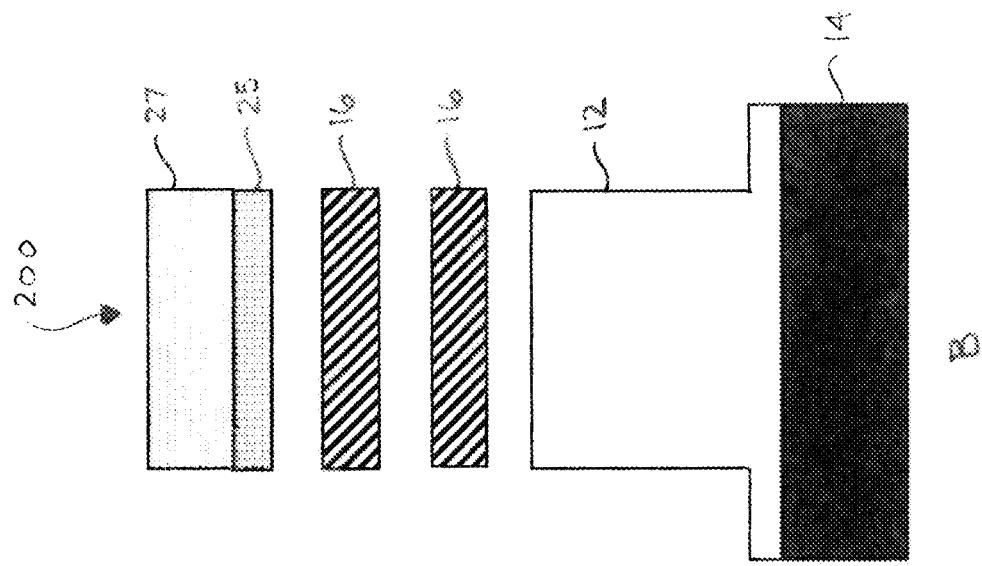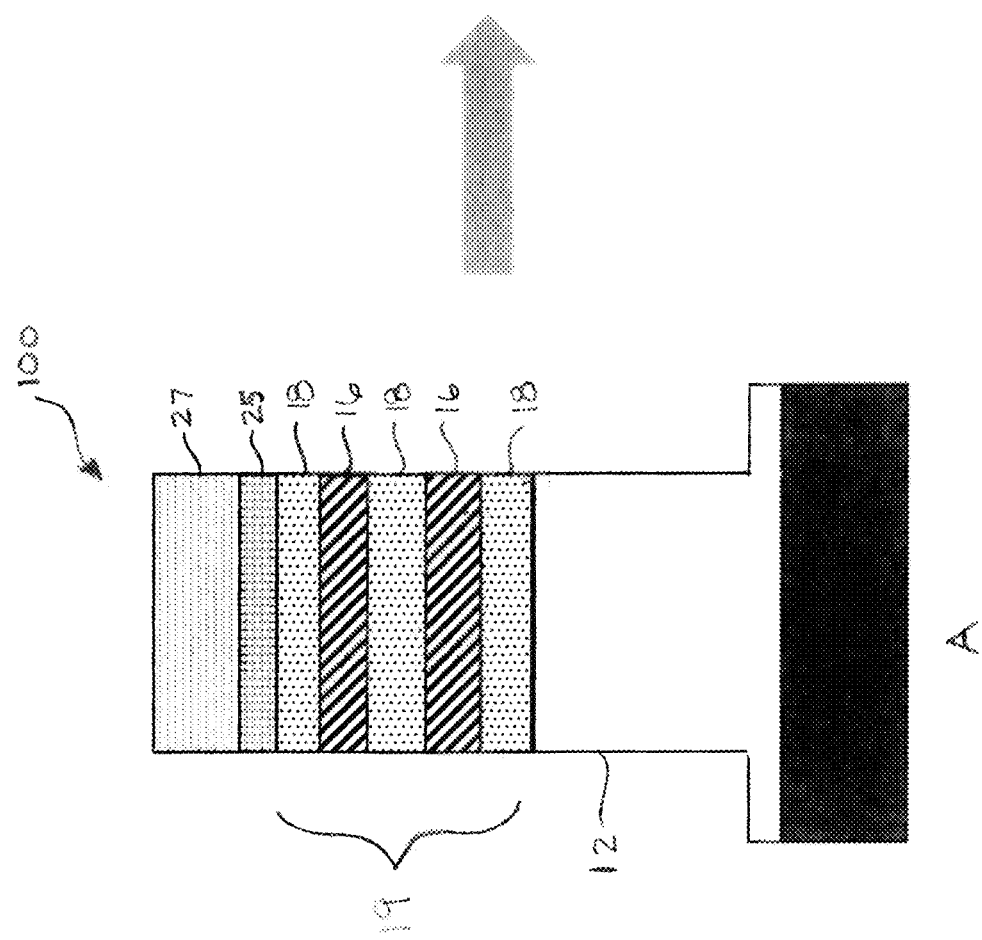

ETCHING SOLUTION FOR SELECTIVELY REMOVING SILICON-GERMANIUM ALLOY FROM A SILICON-GERMANIUM/ GERMANIUM STACK DURING MANUFACTURE OF A SEMICONDUCTOR DEVICE

CROSS REFERENCE TO RELATED APPLICATIONS

This application claims priority under 35 U.S.C. § 119(e) to U.S. provisional patent application No. 62/641,168, filed on Mar. 9, 2018, the entirety of which is incorporated herein by reference.

BACKGROUND OF THE INVENTION

The present invention relates to aqueous etching solutions used in the manufacture of semiconductor devices. More specifically, the invention provides an aqueous etching solution that exhibits increased etch selectivity of silicon-germanium alloy films over germanium films in silicon-germanium/germanium composite semiconductor devices.

With constant down-scaling and increasingly demanding requirements to the speed and functionality of ultra-high density integrated circuits, conventional planar metal-oxide-semiconductor field effect transistors (MOSFETs) face increasing challenges with such issues as scaling of gate oxide thickness and electrostatic control of the gate electrode over the channel region. Fin field effect transistors (FinFETs) have exhibited improved control over a planar gate MOSFET design by wrapping the gate electrode over three sides of a fin-shaped channel.

GAA MOSFETs are similar to FinFETs but have the potential of even greater electrostatic control over the channel because the gate electrode completely surrounds the channel. In a GAA MOSFET, the channel region is essentially a nanowire. The nanowire channel typically has a thickness (or diameter) in the tens of nanometers (nm) or less and has an unconstrained length. The nanowire channel is suspended generally horizontally between, and anchored to, the much larger source and drain regions of the GAA MOSFET.

GAA MOSFETs can be fabricated on a bulk silicon substrate utilizing fully compatible CMOS technology. A typical manufacturing method of forming the channel regions in a GAA MOSFET involves epitaxially growing a stack (epi-stack) of sacrificial layers sandwiched between channel layers on top of a bulk substrate. The sacrificial layers and channel layers are composed of two different materials so that selective etching can remove the sacrificial layers.

By way of example, an epi-stack can be formed of alternating germanium (Ge) and silicon germanium (SiGe) layers, wherein the SiGe layers are the sacrificial layers and the Ge layers are the channel layers. The SiGe layers can then be removed by selective etching (for example via a wet etching process solution), which also inadvertently recesses trenches into the bulk substrate due to the similarity of materials composing the sacrificial layers and the substrate. The Ge layers can subsequently be formed into the nanowire channels suspended over the trenches. A thin gate dielectric is then disposed around the Ge nanowire channels and over the recessed trenches of the substrate. Metal is then disposed over the dielectric to form the metal gate electrode of the GAA MOSFET.

Conventional wet chemical etching solutions for etching SiGe alloys typically employ an oxidizer and an oxide removal agent. The most common solutions are HF for silicon oxide etching and a solution of hydrogen peroxide ($H_2O_2$) and acetic acid ($CH_3COOH$) for SiGe oxidation. A $H_2O_2/CH_3COOH/HF$ mixture is highly selective towards $Si_{1-x}Ge_x$ over Si with improved smoothness; however, the present inventors found that this chemistry is not as effective at removing silicon-germanium on vertical stacks and is not compatible with nitride/oxide masks due to high etch rate on oxide and nitride.

Accordingly, there is a need in the art for a silicon-germanium etchant composition and method for using the composition in forming, for example, Ge nanowire channels in GAA MOSFETs, which provides better control of the etching process during removal of sacrificial SiGe layers that does not suffer from the above-mentioned drawbacks.

BRIEF SUMMARY OF THE INVENTION

In one aspect, the present invention provides an etching solution suitable for the selective removal of silicon-germanium over germanium from a microelectronic device, which comprises: water; oxidizer; water-miscible organic solvent; fluoride ion source; corrosion inhibitor, and optionally one or more of the following: surfactant, chelating agent and buffer (also referred to as buffer system or buffer composition). For the preferred compositions the selectivity of the etch for silicon-germanium over germanium is greater than about 2, or greater than about 2.5, or greater than about 3, or greater than about 3.5 or greater than about 4, or greater than about 4.5, or greater than about 5. Further, for the preferred compositions, the etch rate for the Ge is less than 25 Å/min, or less than 20 Å/min or less than 15 Å/min or less than 13 Å/min or less than 12 Å/min.

In another aspect, the present invention provides a method of selectively enhancing the etch rate of silicon-germanium relative to germanium on a composite semiconductor device comprising germanium and silicon-germanium, the method comprising the steps of: contacting the composite semiconductor device comprising germanium and silicon-germanium with an aqueous composition comprising: water; an oxidizer; a water-miscible organic solvent; a fluoride ion source; a corrosion inhibitor, and optionally one or more of the following: a surfactant; a chelating agent and a buffer and rinsing the composite semiconductor device after the silicon-germanium is at least partially removed, wherein the selectivity of the etch for silicon-germanium over germanium is greater than about 2, or greater than about 2.5, or greater than about 3, or greater than about 3.5 or greater than about 4, or greater than about 4.5, or greater than about 5.

The embodiments of the invention can be used alone or in combinations with each other.

In some embodiments, the composition and method of this invention provides one or more of the following benefits: SiGe/Ge etching selectivity, in some embodiments, greater than 2; compatibilty with nitride/oxide masks; substantially complete, if not complete, removal of the sacrificial SiGe layers to successfully fabricate the Ge nanowire; low etch rates on silicon nitride/silicon oxide, which prevent spacer/ILD oxide from being attacked in the nanowire release process; no observable increase in surface roughness with respect to the untreated surface, indicating the nanowire surface quality is not affected by the etching process; and no chemical contamination remaining on the nanowire surface.

BRIEF DESCRIPTION OF THE FIGURE

FIG. 1 shows one embodiment of the SiGe/Ge stack on a wafer from which the SiGe layers are etched and/or removed by the compositions and method of this invention.

DETAILED DESCRIPTION OF THE INVENTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The use of the terms "a" and "an" and "the" can be substituted with "one or more than one" or "one" or "more than one" wherever they appear. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. The use of the term "comprising" in the specification and the claims includes the more narrow language of "consisting essentially of" and "consisting of".

Embodiments of this invention are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The present invention relates generally to compositions useful for the selective removal of silicon-germanium alloys over germanium from a microelectronic device having such material(s) thereon during its manufacture. The silicon-germanium alloys may comprise any amount of silicon and germanium.

For ease of reference, "microelectronic device" corresponds to semiconductor substrates, flat panel displays, phase change memory devices, and other products including solar substrates, photovoltaics, and microelectromechanical systems (MEMS), manufactured for use in microelectronic, integrated circuit, or computer chip applications. It is to be understood that the term "microelectronic device" is not meant to be limiting in any way and includes any substrate that will eventually become a microelectronic device or microelectronic assembly.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than 0.001 wt. %. "Substantially free" also includes 0.000 wt. %. The term "free of" means 0.000 wt. %.

As used herein, "about" is intended to correspond to ±5% of the stated value.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In the broad practice of this aspect, the etching solution of the present development comprises, consists essentially of, or consists of water; an oxidizer; a water-miscible organic solvent; a fluoride ion source; a corrosion inhibitor, and optionally, a surfactant, a chelating agent and/or a buffer or a buffer system.

In some embodiments, the etching solution compositions disclosed herein are formulated to be substantially free or free of inorganic bases and/or quaternary ammonium compounds, that may include quaternary ammonium fluorides and/or quaternary ammonium hydroxides, for examples the composition may be free of one or more of the following: tetramethylammonium fluoride, tetraethylammonium fluoride, methyltriethylammonium fluoride, and tetrabutylammonium fluoride, tetramethylammonium hydroxide, tetraethylammonium hydroxide, methyltriethylammonium hydroxide, and/or tetrabutylammonium hydroxide and/or hydrofluoric acid. In alternative embodiments, the etching compositions of the present invention may be free of or substantially free of certain oxidizing agents. The composition may be free of or substantially free of one or more of the following: peroxy-compounds, i.e., compounds that comprise at least one peroxy group (—O—O—), including for examples, peroxides, persulfates (e.g., monopersulfates and dipersulfates), percarbonates, and acids thereof, and salts thereof, and mixtures thereof. Other oxidizing agents that the composition may be free of include one or more of the following: oxidized halides (e.g., iodates, periodates, and acids thereof, and mixtures thereof, and the like), perboric acid, perborates, percarbonates, peroxyacids (e.g., peracetic acid, perbenzoic acid, salts thereof, mixtures thereof, and the like), permanganates, cerium compounds, ferricyanides (e.g., potassium ferricyanide), mixtures thereof, and the like. In alternative embodiments, the etching compositions of the present invention may be free of or substantially free of any one or more of the following in any combination: hydrogen peroxide, urea hydrogen peroxide, periodic acid, potassium iodate, potassium permanganate, ammonium persulfate, ammonium molybdate, ferric nitrate, nitric acid, potassium nitrate, ammonia, and mixtures thereof.

The headings employed herein are not intended to be limiting; rather, they are included for organizational purposes only.

Water

The etching compositions of the present development are aqueous-based and, thus, comprise water. In the present invention, water functions in various ways such as, for example, to dissolve one or more components of the composition, as a carrier of the components, as an aid in the removal of residue, as a viscosity modifier of the composition, and as a diluent. Preferably, the water employed in the cleaning composition is de-ionized (DI) water.

It is believed that, for most applications, the weight percent of water in the composition will be present in a range with start and end points selected from the following group of numbers: 0.5, 1, 5, 10, 15, 18, 20, 22, 25, 30, 40, 42, 45, 47, 50, 60, 70, 80, and 90. Examples of the ranges of water (from all sources) that may be used in the composition include, for examples, from about 0.5% to about 90% by wt., or 1% to about 85% by wt. of water; or from about 5.0% to about 80% by wt., or from about 10% to about 70% by wt. of water. Still other preferred embodiments of the present invention may include water in an amount to achieve the desired weight percent of the other ingredients.

Oxidizer

The etching compositions of the present invention comprise an oxidizing agent, also referred to as an "oxidizer." The oxidizer functions primarily to etch silicon-germanium alloy by forming a corresponding oxide with the silicon-germanium alloy. The oxidizing agent can be any suitable oxidizing agent that will not form an oxide with the silicon-germanium alloy. Suitable oxidizing agents include weak oxidizers, such as quinones, such as 1,4-Benzoquinone, 1,2-Benzoquinone, 1,4-Naphthoquinone, and 9,10-Anthraquinone and the like.

In some embodiments, the amount of oxidizer will comprise from about 0.001% to about 40% by weight, or from about 0.01% to about 20% by weight, or from about 0.05% to about 10% by weight, or from 0.1% to about 5% by weight, or from 0.2% to about 3% by weight of the composition, or any range using any of the just-listed numbers and 0.07, 0.3, 0.6, 0.9, 1, 1.5, 2 and 8 to define the endpoints of the range, for examples, about 0.01% to about 3% by weight, or about 3% to about 10% by weight.

In alternative embodiments, mixtures of weak oxidiziers may be used with small amounts, for examples less than 0.1 wt %, or less than 0.05 wt %, or less than 0.01 wt % of additional oxidizers, such as, peroxy-compounds, i.e., compounds that comprise at least one peroxy group (—O—O—), including for examples, peroxides, persulfates (e.g., monopersulfates and dipersulfates), percarbonates, and acids thereof, and salts thereof, and mixtures thereof, oxidized halides (e.g., iodates, periodates, and acids thereof, and mixtures thereof, and the like), perboric acid, perborates, percarbonates, peroxyacids (e.g., peracetic acid, perbenzoic acid, salts thereof, mixtures thereof, and the like), permanganates, cerium compounds, ferricyanides (e.g., potassium ferricyanide), mixtures thereof, and the like hydrogen peroxide, urea hydrogen peroxide, periodic acid, potassium iodate, potassium permanganate, ammonium persulfate, ammonium molybdate, ferric nitrate, nitric acid, potassium nitrate, ammonia, and mixtures thereof.

Fluoride Ion Source

The etching compositions of the present disclosure also comprises one or more sources of fluoride ion. Fluoride ion functions principally to assist in removal of the oxidized SiGe. Typical compounds that provide a fluoride ion source according to the present invention are hydrofluoric acid, ammonium fluoride, quaternary ammonium fluorides such as, for example, fluoroborates, fluoroboric acid, tetrabutylammonium tetrafluoroborate, aluminum hexafluoride, and a fluoride salt of an aliphatic primary, secondary or tertiary amine having the formula:

$$R^1NR^2R^3R^4F,$$

wherein $R^1$, $R^2$, $R^3$ and $R^4$ individually represent H or a ($C_1$-$C_4$) alkyl group. Typically, the total number of carbon atoms in the $R^1$, $R^2$, $R^3$ and $R^4$ groups is 12 carbon atoms or less. Examples of fluoride salts of an aliphatic primary, secondary or tertiary amine such as, for example, tetramethylammonium fluoride, tetraethylammonium fluoride, methyltriethylammonium fluoride, and tetrabutylammonium fluoride.

In selecting the source of the fluoride ion, consideration should be given as to whether or not the source releases ions that would adversely affect the surface being cleaned. For example, in cleaning semiconductor elements, the presence of sodium or calcium ions in the cleaning composition can have an adverse effect on the surface of the element. In some embodiments, the fluoride ion source is ammonium fluoride.

It is believed that the amount of the compound used as the source of the fluoride ion in the cleaning composition will, for most applications, comprise, about 0.01 to about 8% by weight or from about 0.01 to about 20% by weight of a solution 40% ammonium fluoride, or stoichiometric equivalent thereof. Preferably, the compound comprises from about 0.02 to about 8% by weight, more preferably from about 0.02 to about 6% by weight, still more preferably, about 1 to about 8% by weight, and most preferably, from about 0.025% to about 5% by weight of a solution of about 40% ammonium fluoride. In some embodiments, the composition will comprise about 0.01 to about 8% by weight or about 0.01 to about 7% by weight of a fluoride ion source, which may be provided by a 40% ammonium fluoride solution. Preferably, the compound comprises from about 0.02 to about 6% by weight of a fluoride ion source and, most preferably, from about 0.025% to about 5% or from about 0.04 to about 2.5% by weight of a fluoride ion source or from about 0.05 to about 15% by weight of a solution of 40% ammonium fluoride, most preferably, from about 0.0625% to about 12.5% or from about 0.1 to about 6.25% by weight of a solution of 40% ammonium fluoride. Converting the above endpoints for ranges of a 100% fluoride ion source useful in the composition of this invention provides the following endpoints: 0.004, 0.008, 0.01, 0.02, 0.025, 0.026, 0.04, 0.07, 0.1, 0.2, 0.4, 1, 1.2, 2.5, 1.8, 2, 2.4, 2.5, 2.8, 3.2, 5, 6, 7 and 8 wt % fluoride ion source (100% strength). The endpoints can be used in any combination, such as, from about 2 to about 6 wt %, or from about 0.004 to about 0.01 wt %, or from about 0.04 to about 2 wt % fluoride ion source. It should be understood that the amount of fluoride ion used will typically depend, however, on the particular substrate being cleaned. For example, in certain cleaning applications, the amount of the fluoride ion can be relatively high when cleaning substrates that comprise dielectric materials that have a high resistance to fluoride etching. Conversely, in other applications, the amount of fluoride ion should be relatively low, for example, when cleaning substrates that comprise dielectric materials that have a low resistance to fluoride etching. The latter is more typical for most substrates treated with the composition and method of this invention.

Water-Miscible Solvent

The etching compositions of the present invention comprise one or more water-miscible solvents. Examples of water-miscible organic solvents that can be employed are ethylene glycol, propylene glycol, butyl diglycol, 1,4-butanediol, tripropylene glycol methyl ether, propylene glycol propyl ether, diethylene gycol n-butyl ether (e.g., commercially available under the trade designation Dowanol DB), hexyloxypropylamine, poly(oxyethylene)diamine, dimethylacetamide (DMAC), dimethylsulfoxide, tetrahydrofurfuryl alcohol, glycerol, alcohols, pyrrolidones, such as n-methyl pyrrolidone, sulfur-containing solvents, such as sulfoxides, such as dimethylsulfoxide (DMSO), sulfolane, sulfolene, sulfone, or mixtures thereof. In one embodiment the preferred solvents are sulfur-containing solvents used alone or in mixtures of more than one sulfur-containing solvents, or in mixtures of one or more sulfur-containing solvents and one or more non-sulfur containing solvents.

In some embodiments of the present invention, the water-miscible organic solvent may comprise a glycol ether. Examples of glycol ethers include ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl either, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monethyl ether acetate, propylene glycol methyl ether acetate, propylene glycol monomethyl ether, propylene glycol dimethyl ether, propylene glycol monobutyl ether, propylene glycol, monopropyl ether, dipropylene glycol monomethyl ether, dipropylene glycol monopropyl ether, dipropylene glycol monoisopropyl ether, dipropylene monobutyl ether, diproplylene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy) ethanol. In some embodiments mixtures of one or more glycol ethers may be used, or mixtures of one or more glycol ethers and other solvents, or mixtures of one or more glycol ethers and one or more sulfur-containing solvents may be used in the etching compositions of this invention.

It is believed that, for most applications, the amount of water-miscible organic solvent in the composition may be in a range having start and end points selected from the following list of weight percents: 7, 12, 15, 20, 25, 30, 35, 40, 45, 47, 50, 52, 55, 60, 64, 65, 70, 75, 79, 80, 85, 90. Examples of such ranges of solvent (or the total of one or more solvents) include from about 7% to about 65% by weight; or from about 15% to about 75% by weight; or from about 20% to about 80% by weight; or from about 35% to about 64% by weight; or from about 40% to about 70% by weight; or from about 45% to about 60% by weight; or from about 50% to about 65% by weight; or from about 47% to about 64% by weight of the composition.

Corrosion Inhibitors

Another component of the etching composition is a corrosion inhibitor which functions to protect the germanium. Useful corrosion inhibitors include catechol; (C1-C6) alkylcatechol such as methylcatechol, ethylcatechol and tert-butylcatechol, triazoles, such as, benzotriazole, (C1-C10) alkylbenzotriazoles, 1,2 3-triazoles, 1,2,4-triazole, benzotriazole, (C1-C10) alkylbenzotriazoles; Benzotriazole-5-carboxylic acid, imidazole, citric acid, tartaric acid, gluconic acid, saccharic acid, glyceric acid, oxalic acid, phthalic acid, maleic acid, mandelic acid, malonic acid, lactic acid, salicylic acid, gallic acid, gallic acid esters such as methyl gallate and propyl gallate, and the like, cysteine, methylbis (1-dimethylaminoethyl)amine (polycat 5), 1-octylamine, quinoline and quinoline derivatives, such as, hydroxy-substituted quinolines, such as 8-hydroxyquinoline, alkyl-substituted quinolines, such as, 2-methyl quinoline and 4-methyl quinoline, cetyltrimethyl ammonium bromide (CTAB), 11-mercaptoundecanoic acid, n-methyl-n-octylamine. The preferred are 8-hydroxyquinoline, cetyltrimethyl ammonium bromide (CTAB), 1-mercaptoundecanoic acid and n-methyl-n-octylamine.

It is believed that the corrosion inhibitor, if present, will be in the composition in an amount of from about 0.1 wt. % to about 10 wt. %, preferably in an amount of from about 0.2 wt. % to about 5 wt. %, or about 0.4 wt % to about 4 wt % of the composition or in any wt % range having start and end points selected from the following list of numbers: 0.01, 0.03, 0.05, 0.07, 0.1, 0.2, 0.3, 0.4, 0.8, 1, 3, 4, 5, 7 and 10.

Chelating Agent (Optional)

Another component of the etching composition is a chelating agent that can function to increase the capacity of the composition to retain metals in solution and to enhance the dissolution of metallic residues. Typical examples of chelating agents useful for this purpose are the following organic acids and their isomers and salts: ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N, N,N', N'-ethylenediaminetetra (methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, and nitrotriacetic acid (NTA). Preferred chelating agents are aminocarboxylic acids such as EDTA, CyDTA and aminophosphonic acids such as EDTMP.

It is believed that the chelating agent, if present, will be in the composition in an amount of from about 0.1 wt. % to about 10 wt. %, preferably in an amount of from about 0.2 wt. % to about 5 wt. %, or about 0.4 wt % to about 4 wt % of the composition or in any wt % range having start and end points selected from the following list of numbers: 0.05, 0.07, 0.1, 0.2, 0.3, 0.4, 1, 4, 5 and 10.

In some embodiments the compositions of this invention will be free of or substantially free of some or all of the above-listed chelating agents added to the composition, for examples, the composition may be substantially free of or free of EDTA and/or CyDTA and/or EDTMP.

Surfactants (Optional)

The etching compositions of the present invention optionally comprise at least one surfactant. The surfactant functions to protect the silicon from etching. Surfactants for use in the compositions described herein include, but are not limited to, amphoteric salts, cationic surfactants, anionic surfactants, zwitterionic surfactants, non-ionic surfactants, and combinations thereof including, but not limited to, bis(2-ethylhexyl)phosphate, perfluoroheptanoic acid, decanoic acid, prefluorodecanoic acid, trifluoromethanesulfonic acid, phosphonoacetic acid, dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12 hydroxystearic acid, dodecyl phosphate.

Non-ionic surfactants contemplated include, but are not limited to, polyoxyethylene lauryl ether (Emalmin NL-100 (Sanyo), Brij 30, Brij 98, Brij 35), dodecenylsuccinic acid monodiethanol amide (DSDA, Sanyo), ethylenediamine tetrakis(ethoxylate-block-propoxylate) tetrol (Tetronic 90R4), polyethylene glycols (e.g., PEG 400), polypropylene glycols, polyethylene or polypropylene glycol ethers, block copolymers based on ethylene oxide and propylene oxide (Newpole PE-68 (Sanyo), Pluronic L31, Pluronic 31 R1, Pluronic L61, Pluronic F-127), polyoxypropylene sucrose ether (SN0085, Sanyo), t-octylphenoxypolyethoxyethanol (Triton X100), 10-ethoxy-9,9-dimethyldecan-1-amine (TRITON® CF-32), Polyoxyethylene (9) nonylphenylether, branched (IGEPAL CO-250), polyoxyethylene (40) nonylphenylether, branched (IGEPAL CO-890), polyoxyethylene sorbitol hexaoleate, polyoxyethylene sorbitol tetraoleate, polyethylene glycol sorbitan monooleate (Tween 80), sorbitan monooleate (Span 80), a combination of Tween 80 and Span 80, alcohol alkoxylates (e.g., Plurafac RA-20), alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives such as SIS6952.0 (Siliclad, Gelest), siloxane modified polysilazane such as PP1-SG10 Siliclad Glide 10 (Gelest), silicone-polyether copolymers such as Silwet L-77 (Setre Chemical Company), Silwet ECO Spreader (Momentive), and ethoxylated fluorosurfactants (ZONYL® FSO-100, ZONYL® FSN-100).

Cationic surfactants contemplated include, but are not limited to, tetraethylammonium, stearyl trimethylammonium chloride (Econol TMS-28, Sanyo), 4-(4-diethylaminophenylazo)-1-(4-nitrobenzyl)pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldiocta-decylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis(decyl)ammonium bromide, Aliquat® 336 and oxyphenonium bromide, guanidine hydrochloride ($C(NH_2)_3Cl$) or triflate salts such as tetrabutylammonium trifluoromethanesulfonate, dimethyldioctadecylammonium chloride, dimethyldihexadecylammonium bromide and di(hydrogenated tallow)dimethylammonium chloride (e.g., Arquad 2HT-75, Akzo Nobel).

In some embodiments, the cationic surfactant, if employed, comprises polyalkyleneimine. Preferably, the polyalkyleneimine is a polyethyleneimine (PEI). Any PEI may be used, but it is preferred that a homopolymeric polyethyleneimine is employed, if used. The PEI may be branched or linear, but preferably it is branched.

While it has been found that the PEI used may have any formula weight for effectiveness, preferably the PEI has a lower formula weight (FW). In an embodiment, the PEI has a FW between 100 and 50,000, between 400 and 25,000, between 800 and 10,000, or between 1000 and 3000.

In an embodiment, the polyalkyleneimine comprises a polyethyleneimine (PEI) and preferably the PEI comprises less than 1% by weight of the composition, preferably less than 0.5% by weight, preferably less than 0.25% by weight of the composition and most preferably less than 0.2% by weight of the composition. Preferably the PEI has a molecular weight between 100 and 2500, preferably 200 and 1500 and most preferably between 400 and 1200.

In an embodiment, the polyalkyleneimine has a molecular weight between 100 and 2500, between 200 and 1500, between 400 and 1200, or between 700 and 900. A molecular weight of 800 is particularly suitable. The molecular weight is suitably determined by light scattering techniques known in the art.

Polyethyleneimines are commercially available, for example Lupasol® 800 which is supplied by BASF.

Anionic surfactants contemplated include, but are not limited to, ammonium polyacrylate (e.g., DARVAN 821A), modified polyacrylic acid in water (e.g., SOKALAN CP10S), phosphate polyether ester (e.g., TRITON H-55), SAS-10, decylphosphonic acid, dodecylphosphonic acid (DDPA), tetradecylphosphonic acid, hexadecylphosphonic acid, octadecylphosphonic acid, dodecylbenzenesulfonic acid, poly(acrylic acid sodium salt), sodium polyoxyethylene lauryl ether, sodium dihexylsulfosuccinate, dicyclohexyl sulfosuccinate sodium salt, sodium 7-ethyl-2-methyl-4-undecyl sulfate (Tergitol 4), SODOSIL RM02, and phosphate fluorosurfactants such as Zonyl FSJ and ZONYL® UR.

Zwitterionic surfactants include, but are not limited to, acetylenic diols or modified acetylenic diols (e.g., SURFONYL® 504), cocamido propyl betaine, ethylene oxide alkylamines (AOA-8, Sanyo), N,N-dimethyldodecylamine N-oxide, sodium cocaminpropinate (LebonApl-D, Sanyo), 3-(N,N-dimethylmyristylammonio)propanesulfonate, and (3-(4-heptyl)phenyl-3-hydroxypropyl)dimethylammoniopropanesulfonate. Preferably, the at least one surfactant comprises dodecylbenzene sulfonic acid, dodecyl phosphonic acid, dodecyl phosphate, TRITON X-100, SOKALAN CP10S, PEG 400, and PLURONIC F-127.

When present, the amount of surfactant may be in a range from about 0.001 wt % to about 1 wt %, preferably about 0.1 wt % to about 1 wt %, based on the total weight of the concentrate. Alternatively, it is believed that for some applications, if present, the one or more surfactants will comprise from about 0.1 wt. % to about 15 wt. % of the composition; or from about 0.1 wt. % to about 10 wt. %, or from about 0.5 wt. % to about 5 wt. %, or from about 0.1 wt. % to about 1 wt. %, or about 0.5 wt. % to about 5 wt. % of the composition. In alternative embodiments the weight percent of surfactant in the composition, based on the total weight of the composition may be within any range having start and end points selected from the following: 0.05, 0.1, 0.5, 1, 5, 10, 15, 20 and 30.

In some embodiments the compositions of this invention will be free of or substantially free of any or all of the above-listed surfactants.

Buffer (Optional)

The etching compositions optionally include a buffer composition. The buffer composition may comprise, consists essentially of, or consist of an amine compound and a polyfunctional organic acid as detailed below.

Amine Compound (Buffer)

In some embodiments, the optional buffer composition of the etching compositions of the present disclosure comprise a secondary or tertiary organic amine. The secondary or tertiary organic amine functions primarily to provide the conjugate base component of the buffer.

Examples of secondary or tertiary organic amine compounds for use as a buffer component in certain preferred embodiments of the present disclosure, include the alkanolamines. Preferred alkanolamines include the lower alkanolamines which are secondary and/or tertiary having from 1 to 5 carbon atoms. Examples of such alkanolamines include diethanolamine, di- and triisopropanolamine, 2-(2-aminoethylamino)ethanol, 2-(2-aminoethoxy)ethanol, triethanolamine, N-ethyl ethanolamine, N,N-dimethylethanolamine, N,N-diethyl ethanolamine, N-methyl diethanolamine, N-ethyl diethanolamine, cyclohexylaminediethanol, and mixtures thereof.

In one embodiment, the amine compound may be an alkanolamine selected from the group consisting of triethanolamine (TEA), diethanolamine, N-methyl diethanolamine, diisopropanolamine, N-methyl ethanol amine, and mixtures thereof.

In other embodiments, ammonium salts may be used as the base of the buffer with the one or more acids of the buffer. When the acids are reacted with the ammonium base, they form, for example, ammonium chloride, ammonium sulfate, ammonium nitrate, ammonium carbonate, ammonium hypochlorite, ammonium chlorate, ammonium permanganate, ammonium acetate, dibasic ammonium phosphate, diammonium citrate, triammonium citrate (TAC), ammonium sulfamate, ammonium oxalate, ammonium formate, ammonium tartrate, ammonium bitartrate and ammonium glycolate. In some embodiments, one or more of the above-listed ammonium salts may be added to the composition as part of the buffer (in addition to an acid, such as polyfunctional acid) to buffer the composition. In those embodiments the buffer may comprise the one or more than one ammonium salt and the one or more acids.

The weight percent of the optional base, if present, that is added to buffer the composition relative to the weight percent of the organic acid and inorganic acid. The buffer solution is an aqueous solution consisting of a mixture of a weak acid and its conjugate base, or vice versa present in the composition that act together to buffer the composition may be within the range of from 1:10 to 10:1, or from 1:8 to 8:1, or from 1:5 to 5:1, or from 1:3 to 3:1, or from 1:2 to 2:1, or from 1.5:1 to 1:1.5, or from 1.3:1 to 1:1.3 or from 1.1:1 to 1:1.1.

It is believed that the amount of the amine compound added as part of the buffer composition, if present in the composition will comprise from about 10% to about 30% by weight of the composition, specifically, about 20% to about 30% by weight of the composition, or alternatively from greater than 0.1 wt % to less than 10 wt %, or from greater than 0.1 wt % to less than 5 wt %, or from greater than 0.1 wt % to 2 wt %.

Preferably, the amine compound has a pKa<9.0.

Polyfunctional Organic Acid (Buffer Component)

In some embodiments, the optional buffer composition of the etching compositions of the present disclosure comprise one or more polyfunctional organic acids, which function primarily as the conjugate acid portion of the buffer. As used herein, the term "polyfunctional organic acid" refers to an acid or a multi-acid that has more than one carboxylate group, including but not limited to, (i) dicarboxylate acids (such as malonic acid, malic acid, et al); dicarboxylic acids with aromatic moieties (such as phthalic acid et al), and combinations thereof; and (ii) tricarboxylic acids (such as citric acid et al), tricarboxylic acids with aromatic moieties (such as trimellitic acid, et al), and combinations thereof. The acid if present in the composition may serve more than one purpose, such as, the acid may act as a corrosion inhibitor as well as a buffer component.

Preferred acids for the buffer system are polyprotic that have at least three carboxylic acid groups. Such acids have at least a second and a third dissociation constant, each of which is higher relative to its respective preceding constant. This indicates that the acid loses a first proton more easily than a second one, because the first proton separates from an ion of a single negative charge, whereas the second proton separates from the ion of a double negative charge. It is believed that the double negative charge strongly attracts the proton back to the acid ion. A similar relationship exists between the second and third separated protons. Thus, polyprotic acids such as, for example, those having at least three carboxylic acid groups are useful in controlling the pH of a solution, particularly at a pH corresponding to their higher pKa value. Therefore, in addition to having a pKa value of about 5 to about 7, preferred polyprotic acids of the present invention have multiple pKa values, wherein the highest pKa is from about 5 to about 7.

Polyprotic acids having at least three carboxylic acid groups according to the present invention are highly compatible with polyhydric solvents. Examples of preferred polyprotic acids include tricarboxylic acids (e.g., citric acid, 2-methylpropane-1,2,3-triscarboxylic, benzene-1,2,3-tricarboxylic [hemimellitic], propane-1,2,3-tricarboxylic [tricarballylic], 1,cis-2,3-propenetricarboxylic acid [aconitic], and the like), tetracarboxylic acids (e.g., butane-1,2,3,4-tetracarboxylic, cyclopentanetetra-1,2,3,4-carboxylic, benzene-1,2,4,5-tetracarboxylic [pyromellitic], and the like), pentacarboxlyic acids (e.g., benzenepentacarboxylic), and hexacarboxylic acids (e.g., benzenehexacarboxylic [mellitic]), and the like. The respective pKa values of these acids are provided in Table 1. Particularly preferred polyprotic acids include tricarbo xylic acids, with citric acid being most preferred.

TABLE 1

| Acid | pKa value at 25° C. | | | | | |
|---|---|---|---|---|---|---|
| | pK1 | pK2 | pK3 | pK4 | pK5 | pK6 |
| Citric acid | 3.13 | 4.76 | 6.40 | | | |
| 2-Methylpropane-1,2,3-triscarboxylic | 3.53 | 5.02 | 7.20 | | | |
| Benzene-1,2,3-tricarboxylic (hemimellitic) | 2.98 | 4.25 | 5.87 | | | |
| Propane-1,2,3-tricarboxylic (tricarballylic) | 3.67 | 4.84 | 6.20 | | | |
| 1,cis-2,3-Propenetricarboxylic acid, (aconitic) | 3.04 | 4.25 | 5.89 | | | |
| Butane-1,2,3,4-tetracarboxylic | 3.36 | 4.38 | 5.45 | 6.63 | | |
| Cyclopentanetetra-1,2,3,4-carboxylic | 3.07 | 4.48 | 5.57 | 10.06 | | |
| Benzene-1,2,4,5-tetracarboxylic (pyromellitic) | 2.43 | 3.13 | 4.44 | 5.61 | | |
| Benzenepentacarboxylic | 2.34 | 2.95 | 3.94 | 5.07 | 6.25 | |
| Benzenehexacarboxylic (mellitic) | 2.08 | 2.46 | 3.24 | 4.44 | 5.50 | 6.59 |

Citric acid, the preferred polyprotic acid, is a tricarboxylic acid having three pKa values: 3.13, 4.76, and 6.40, corresponding to trihydrogencitrate ions, dihydrogencitrate ions, and monohydrogen citrate ions, respectively. In certain preferred embodiments of the present invention, the buffer system comprises a salt of citric acid, with especially preferred buffers comprising aqueous solutions of ammonium citrate tribasic (TAC) and citric acid.

It is believed that the amount of polyfunctional organic acid in the compositions of the present disclosure will be from about 0.01 wt % to 5 wt %, preferably from 0.05 wt % to 3 wt %, and more preferably from 0.08 wt % to 2 wt %. And, if present, the conjugate salt is present in an amount from about 0.05 wt % to 10 wt %, preferably from 0.1 wt % to 8 wt %, and more preferably from 0.4 wt % to 5.0 wt % or 0.1 wt % to 2 wt %. In some embodiments, each of the acid and base of the buffer may be present in any amounts within any of the wt % ranges defined by the following start and end points: 0.01, 0.05, 0.08, 0.1, 0.4, 0.8, 1, 2, 3, 5, 8 and 10.

Preferably, the buffer composition of the disclosed etching compositions buffer the compositions. In some embodiments, the pH is from about 4 to about 8. In other embodiments, the pH is from about 4.5 to about 7.5. In other embodiments, the pH is from about 5 to about 7.

Other Optional Ingredients

The etching composition of the present invention may also include one or more of the following additives: chemical modifiers, dyes, biocides, and other additives. The additive(s) may be added to the extent that they do not adversely affect the performance of the composition.

Other commonly known components such as dyes, biocides, etc. can be included in the cleaning composition in conventional amounts, for example, amounts up to a total of about 5 weight % of the composition.

In some embodiments, the composition may be substantially free of or free of one or more of the following: hydroxides, metal hydroxides, such as KOH or LiOH or NaOH. In other embodiments, the composition may be substantially free of or free of a halide-containing compound other than one or more fluorine-containing compounds, for example it may be substantially free or free of one or more of the following: bromine-, chlorine- or iodine-containing compounds. In other embodiments, the composition may be substantially free or free of sulfonic acid and/or phosphoric acid and/or sulfuric acid and/or nitric acid and/or hydrochloric acid and/or inorganic acids and/or acetic acid and/or organic acids. In other embodiments, the composition may be substantially free or free of sulfates and/or nitrates and/or sulfites and/or nitrites. In other embodiments, the composition may be substantially free or free of: ammonium hydroxide and/or ethyl diamine. In other embodiments, the composition may be substantially free or free of: sodium-containing compounds and/or calcium-containing compounds and/or manganese-containing compounds or magnesium-containing compounds and/or chromium-containing compounds and/or sulfur-containing compounds.

The etching solution composition of the present invention is typically prepared by mixing the components together in a vessel at room temperature until all solids have dissolved in the aqueous-based medium.

Method

In another aspect there is provided a method of selectively enhancing the etch rate of silicon-germanium relative to germanium on a composite semiconductor device comprising germanium and silicon-germanium, the method comprising the steps of: contacting the composite semiconductor device comprising germanium and silicon-germanium with an aqueous composition comprising: water; an oxidizer; a water-miscible organic solvent; a fluoride ion source; a corrosion inhibitor and optionally, a buffer, and/or a surfactant and/or a chelating agent; and rinsing the composite semiconductor device after the silicon-germanium is at least partially removed, wherein the selectivity of the etch for silicon-germanium over germanium is greater than about 2 or greater than about 3 or greater than about 10 or greater than about 15 or greater than about 20 or greater than about 25 or greater than about 30 or greater than about 35 or greater than about 40. An additional drying step may also be included in the method. "At least partially removed" means removal of at least 50% of the material, preferably at least 80% removal. Most preferably, 100% removal of silicon-germanium is achieved using the compositions of the present development.

The contacting step can be carried out by any suitable means such as, for example, immersion, spray, or via a single wafer process. The temperature of the composition during the contacting step is preferably from about 25 to about 100° C. and more preferably from about 30 to about 50° C.

In some embodiments, the etch selectivity for silicon-germanium over Ge from, for example, a horizontal stack observed with the composition of the present invention is greater than 2 or greater than 2.5 or greater than 3 or greater than 10, more preferably from about 10 or 20 to 40.

Compositions of the present invention preferably exhibit the following performance characteristics: etch rate selectivity on SiGe/Ge is greater than 2, or greater than 2.5, or greater than 3, or greater than 10, and/or SiN etch rate of less than 5 Å/min, and/or thermal oxide etch rate of less than 10 Å/min, or less than 7 Å/min, or less than 5 Å/min, or less than 3 Å/min, or less than 1 Å/min, and/or Ge etch rate less than 25 Å/min or less than 20 Å/min, or less than 15 Å/min, or less than 10 Å/min, or less than 7 Å/min.

After the contacting step is an optional rinsing step. The rinsing step may be carried out by any suitable means, for example, rinsing the substrate with de-ionized water by immersion or spray techniques. In preferred embodiments, the rinsing step may be carried out employing a mixture of de-ionized water and an organic solvent such as, for example, isopropyl alcohol.

After the contacting step and the optional rinsing step is an optional drying step that is carried out by any suitable means, for example, isopropyl alcohol (IPA) vapor drying, heat, or by centripetal force.

The features and advantages are more fully shown by the illustrative examples discussed below.

EXAMPLES

General Procedure for Preparing the Cleaning Compositions

All compositions which are the subject of the present Examples were prepared by mixing the components in a 250 mL beaker with a 1" Teflon-coated stir bar. Typically, the first material added to the beaker was deionized (DI) water followed by the other components in no particular order. Typically, the oxidizer is added just prior to use.

Compositions of the Substrate

FIG. 1 shows a schematic of the test substrate 100 treated (etched) by the method of this invention in the examples. Side A of FIG. 1 is the substrate before etching and side B of FIG. 1 is the substrate after treatment (etching). To make the substrate shown on side A of FIG. 1, SiGe/Ge multilayers were deposited by hetero-epitaxy on an Si wafer 14. The SiGe/Ge multilayer deposition started with a thick SiGe (70%) layer 12 on the Si substrate 14. After the SiGe (70%) layer 12, alternating 10 nm (or in other tests 15 nm) thick layers of SiGe (65%) 18 and Ge 16 followed to form the Ge/SiGe multilayer deposition 19 as shown. A silicon oxide 25 and silicon nitride 27 hard mask (HM) were deposited on top of the SiGe (70%) means an alloy consisting of 30% Si and 70% Ge and patterned into parallel FINs on the Si wafer substrate 14. The SiGe/Ge nanowire FINs 18 present on side A wafer were then etched selectively using the method and compositions of this invention (the arrow in FIG. 1 illustrates the method step) and resulted in the formation of the Ge nanowire 16 on the side B wafer 200.

Several SiGe alloys were used to make the test substrates that were tested below. SiGe(70%) means an alloy consisting of 30% Si and 70% Ge. SiGe(65%) means an alloy consisting of 35% Si and 65% Ge. SiGe(50%) means an alloy consisting of 50% Si and 50% Ge.

Processing Conditions

Etching tests were run using 100 g of the etching compositions in a 250 ml beaker with a ½" round Teflon stir bar set at 400 rpm. The etching compositions were heated to a temperature of about 35° C., or between 30 and 45° C. on a hot plate. The test coupons were immersed in the compositions for about 5 or between 3 and 5 minutes while stirring.

The segments were then rinsed for 3 minutes in a DI water bath or spray and subsequently dried using filtered nitrogen. The germanium and silicon-germanium etch rates were estimated from changes in the thickness before and after etching and was measured by spectroscopic ellipsometry using an SCI FilmTek SE2000.

Example 1

This example shows that the selected oxidizer can impact the etch rate of SiGe.

TABLE 2

Effect of oxidizer on SiGe Etch.

|  | 338C | 338F |
|---|---|---|
| Benzoquinone | 0.5 | 0 |
| DMSO | 29.5 | 30 |
| TAC | 1.3 | 1.3 |
| Citric acid | 1.5 | 1.5 |
| DIW | 40 | 40 |
| Poly(ethylene glycol)average Mn = 400 (PEG) | 26.1 | 26.1 |
| NH4F(40%) | 0.7 | 0.7 |
| CTAB | 0.4 | 0.4 |
| strained Ge etch rate at 35 C. | 8.2 | 5.65 |
| SiGe 70% etch rate at 35 C. | 41.07 | 2.74 | unit: A/min

The amounts are wt % of the components. The units of the reported Ge and SiGe etch rates are A/min. The results show that SiGe is not effectively etched if an oxidizer is not present.

Example 2

This example shows the impact of different solvents on etch rates.

TABLE 3

|  | 347P | 360A | 360C | 360E |
|---|---|---|---|---|
| Benzoquinone | 0.4 | 0.4 | 0.4 | 0.4 |
| TAC | 0.5 | 0.5 | 0.5 | 0.5 |
| Citric acid | 0.2 | 0.2 | 0.2 | 0.2 |
| DIW | 42.2 | 42.2 | 42.2 | 42.2 |
| NH4F(40%) | 1.5 | 1.5 | 1.5 | 1.5 |
| 8HQ | 0.6 | 0.6 | 0.6 | 0.6 |
| sulfolane | 54.6 |  |  |  |
| DMSO |  | 54.6 |  |  |
| NMP |  |  | 54.6 |  |
| DMAC |  |  |  | 54.6 |
| strained Ge etch rate at 35 C. | 13.52 | 9 | 23.31 | 9.2 |
| SiGe 50% etch rate at 35 C. | 44.23 | 18.23 | 46.56 | 35.42 |
| TEOS etch rate at 35 C. | 22.44 | 3.33 | 7.33 | 5.33 | unit: A/min

Where TAC is triammonium citrate

8HQ is 8-Hydroxyquinoline

DMSO is Dimethyl sulfoxide

NMP is N-Methyl-2-pyrrolidone

DMAC is Dimethylacetamide

The amounts are wt % of the components. The units of the reported Ge, SiGe and TEOS etch rates are A/min.

Example 3

The following compositions were prepared to determine the effect on the corrosion inhibitor in protecting Ge.

TABLE 4

|  | 343O | 343K | 343P | 343Q | 343R | 343S | 343T | 343U | 343V | 343W | 343X |
|---|---|---|---|---|---|---|---|---|---|---|---|
| Benzoquinone | 0.4 | 0.4 | 0.4 | 0.4 | 0.4 | 0.4 | 0.4 | 0.4 | 0.4 | 0.4 | 0.4 |
| Sulfolane | 29.6 | 29.6 | 29.6 | 29.6 | 29.6 | 29.6 | 29.6 | 29.6 | 29.6 | 29.6 | 29.6 |
| TAC | 1.3 | 1.3 | 1.3 | 1.3 | 1.3 | 1.3 | 1.3 | 1.3 | 1.3 | 1.3 | 1.3 |
| Citric acid | 0.2 | 0.2 | 0.2 | 0.2 | 0.2 | 0.2 | 0.2 | 0.2 | 0.2 | 0.2 | 0.2 |
| DIW | 42 | 41.7 | 41.4 | 41 | 41.9 | 41.86 | 41.86 | 41.9 | 41.9 | 41.6 | 41.6 |
| NH4F(40%) | 1.5 | 1.5 | 1.5 | 1.5 | 1.5 | 1.5 | 1.5 | 1.5 | 1.5 | 1.5 | 1.5 |
| Sulfolane | 25 | 25 | 25 | 25 | 25 | 25 | 25 | 25 | 25 | 25 | 25 |
| CTAB |  | 0.3 |  |  |  |  |  |  |  |  |  |
| polycat 5 |  |  | 0.6 |  |  |  |  |  |  |  |  |
| 8HQ |  |  |  | 1 |  |  |  |  |  |  |  |
| 11-mercaptoundecanoic acid |  |  |  |  | 0.1 |  |  |  |  |  |  |
| N-Methyl-n-Octylamine |  |  |  |  |  | 0.14 |  |  |  |  |  |
| 1-Octylamine |  |  |  |  |  |  | 0.14 |  |  |  |  |
| cysteine |  |  |  |  |  |  |  | 0.1 |  |  |  |
| decanoic acid |  |  |  |  |  |  |  |  | 0.1 |  |  |
| surfynol 485 |  |  |  |  |  |  |  |  |  | 0.4 |  |
| SAS10 |  |  |  |  |  |  |  |  |  |  | 0.4 |

TABLE 4-continued

| | 343O | 343K | 343P | 343Q | 343R | 343S | 343T | 343U | 343V | 343W | 343X |
|---|---|---|---|---|---|---|---|---|---|---|---|
| Strained Ge etch rate @30 C. | 30.99 | 12.28 | 61.14 | 10.75 | 7.4 | 20.31 | 47.25 | 30.6 | 34.02 | 40.99 | 43.13 | unit: A/min

Where: CTAB is cetyltrimethyl ammononium bromide
Polycat 5 is methylbis(2-dimethylaminoethyl)amine or PMDETA
SAS10 is an anionic surfactant.
The amounts are wt % of the components.
The units of the reported Ge etch rate is A/min.

AFM images taken after treatment with compositions of this invention reduced the surface roughness of Ge blanket wafers.

Augur characterizations of the chemical residues remaining on treated blanket wafers indicated that the chemical and corrosion inhibitors were totally removed in the DIW rinse step after treating with the compositions of this invention.

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

The invention claimed is:

1. An etching solution suitable for the selective removal of silicon-germanium alloy over germanium from a microelectronic device, which comprises: water; an oxidizer; from about 12 to about 90 wt % of a water-miscible organic solvent; a fluoride ion source; a corrosion inhibitor; optionally a surfactant; a buffer; and optionally a chelating agent;
wherein said oxidizer comprises a quinone;
wherein said corrosion inhibitor is selected from quinoline, quinoline derivatives, cetyltrimethyl ammonium bromide (CTAB), 1-mercaptoundecanoic acid and n-methyl-n-octylamine; and
wherein the buffer comprises an amine compound and a polyfunctional organic acid.

2. The etching solution of claim 1 wherein the corrosion inhibitor is cetyltrimethyl ammonium bromide (CTAB).

3. The etching solution of claim 1 wherein the oxidizer is selected from the group consisting of 1,4-Benzoquinone, 1,2-Benzoquinone, 1,4-Naphthoquinone, and 9,10-Anthraquinone.

4. The etching solution of claim 1 wherein the composition is substantially free of peroxides.

5. The etching composition of claim 1 wherein the water-miscible solvent is selected from the group consisting of ethylene glycol, propylene glycol, butyl diglycol, 1,4-butanediol, tripropylene glycol methyl ether, propylene glycol propyl ether, diethylene gycol n-butyl ether, hexyloxypropylamine, poly(oxyethylene)diamine, dimethylsulfoxide, tetrahydrofurfuryl alcohol, glycerol, alcohols, sulfoxides, dimethylacetamide, pyrrolidones, sulfur-containing solvents, or mixtures thereof.

6. The etching composition of claim 1 wherein the water-miscible solvent is selected from the group consisting of sulfoxides, sulfolane, sulfolene, sulfone or mixtures thereof.

7. The etching composition of claim 1 wherein the water-miscible solvent is selected from the group consisting of sulfolane, dimethylsulfoxide, n-methylpyrrilodone, polyethylene glycol and dimethylacetamide or mixtures thereof.

8. The etching composition of claim 1 wherein the corrosion inhibitor is 11-mercaptoundecanoic acid.

9. The etching composition of claim 1 wherein the corrosion inhibitor is selected from hydroxy-substituted quinolines, 8-hydroxyquinoline, alkyl-substituted quinolines, 2-methyl quinoline and 4-methyl quinoline.

10. The etching composition of claim 1 wherein the corrosion inhibitor is 8 hydroxyquinoline.

11. The etching composition of claim 1 wherein the corrosion inhibitor comprises quinoline.

12. The etching composition of claim 1 having a pH of from about 4 to about 8.

13. The etching composition of claim 1 wherein the buffer comprises citric acid and triammonium citrate.

14. The etching composition of claim 1, wherein the corrosion inhibitor comprises n-methyl-n-octylamine.

15. The etching composition of claim 1, wherein the amine compound is an alkanolamine and the polyfunctional organic acid is a polyprotic acids having at least three carboxylic acid groups.

16. The etching composition of claim 15, wherein the polyprotic acid is selected from the group consisting of citric acid, 2-methylpropane-1,2,3-triscarboxylic, benzene-1,2,3-tricarboxylic [hemimellitic], propane-1,2,3-tricarboxylic [tricarballylic], 1,cis-2,3-propenetricarboxylic acid [aconitic], e.g., butane-1,2,3,4-tetracarboxylic, cyclopentanetetra-1,2,3,4-carboxylic, benzene-1,2,4,5-tetracarboxylic [pyromellitic], benzenepentacarboxylic, and benzenehexacarboxylic [mellitic]), and mixtures thereof.

17. The etching composition of claim 1 wherein the fluoride ion source is selected from the group consisting of hydrofluoric acid, ammonium fluoride, quaternary ammonium fluorides such as, for example, fluoroborates, fluoroboric acid, tetrabutylammonium tetrafluoroborate, aluminum hexafluoride, and a fluoride salt of an aliphatic primary, secondary or tertiary amine having the formula: $R^1NR^2R^3R^4F$, wherein $R^1$, $R^2$, $R^3$ and $R^4$ individually represent H or a $(C_1-C_4)$ alkyl group.

18. The etching composition of claim 17 wherein the fluoride ion source is selected from the group consisting of ammonium fluoride, ammonium bifluoride, tetramethylammonium fluoride, tetraethylammonium fluoride, methyltriethylammonium fluoride, and tetrabutylammonium fluoride.

19. The etching composition of claim 17 wherein said fluoride ion source is ammonium fluoride.

20. The etching composition of claim 1 wherein the composition comprises the chelating agent.

21. The etching composition of claim 1 wherein the composition comprises the surfactant.

22. A method of selectively enhancing the etch rate of silicon-germanium relative to germanium on a semiconductor device comprising germanium and silicon-germanium, the method comprising the steps of: contacting the semiconductor device comprising silicon and silicon-germanium with an aqueous composition comprising: water; an oxidizer; from 12 to 90 wt % of a water-miscible organic solvent; a fluoride ion source and a corrosion inhibitor; and optionally, a surfactant; optionally a chelating agent and a buffer; wherein said oxidizer comprises a quinone;

wherein said corrosion inhibitor is selected from quinoline, quinoline derivatives, cetyltrimethyl ammonium bromide (CTAB), 1-mercaptoundecanoic acid and n-methyl-n-octylamine; and wherein the buffer comprises an amine compound and a polyfunctional organic acid;

and rinsing the composite semiconductor device after the silicon-germanium is at least partially removed, wherein the selectivity of the etch for silicon-germanium over germanium is greater than about 2.

23. The method of claim 22 further comprising the step of drying the semiconductor device.

24. The method of claim 22 wherein the selectivity of the etch for silicon-germanium over germanium is greater than 2.5.

25. The method of claim 22 wherein the contacting step is performed at a temperature of from about 25° C. to about 60° C.

\* \* \* \* \*